US011430634B2

(12) United States Patent
Godet et al.

(10) Patent No.: US 11,430,634 B2
(45) Date of Patent: Aug. 30, 2022

(54) METHODS OF OPTICAL DEVICE FABRICATION USING AN ELECTRON BEAM APPARATUS

(71) Applicant: Applied Materials, Inc., Santa Clara, CA (US)

(72) Inventors: Ludovic Godet, Sunnyvale, CA (US); Rutger Meyer Timmerman Thijssen, Sunnyvale, CA (US); Kartik Ramaswamy, San Jose, CA (US); Yang Yang, San Diego, CA (US); Manivannan Thothadri, Mountain View, CA (US); Chien-An Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/080,802

(22) Filed: Oct. 26, 2020

(65) Prior Publication Data
US 2021/0066036 A1     Mar. 4, 2021

Related U.S. Application Data

(63) Continuation of application No. 16/716,954, filed on Dec. 17, 2019, now Pat. No. 10,818,472.
(Continued)

(51) Int. Cl.
*H01J 37/305* (2006.01)
*H01J 37/32* (2006.01)
(Continued)

(52) U.S. Cl.
CPC ........ *H01J 37/3053* (2013.01); *G02B 5/1857* (2013.01); *G02B 6/13* (2013.01);
(Continued)

(58) Field of Classification Search
None
See application file for complete search history.

(56) References Cited

U.S. PATENT DOCUMENTS

| 5,116,461 A | 5/1992 | Lebby et al. |
| 5,375,456 A | 12/1994 | Burns |

(Continued)

FOREIGN PATENT DOCUMENTS

| CN | 102360093 A | 2/2012 |
| CN | 107564810 A | 1/2018 |

(Continued)

OTHER PUBLICATIONS

International Search Report and the Written Opinion of the International Searching Authority for Application No. PCT/US2019/064966 dated Mar. 26, 2020.
(Continued)

*Primary Examiner* — Jerry Rahll
(74) *Attorney, Agent, or Firm* — Patterson + Sheridan, LLP (57) ABSTRACT

Aspects of the disclosure relate to apparatus for the fabrication of waveguides. In one example, an angled ion source is utilized to project ions toward a substrate to form a waveguide which includes angled gratings. In another example, an angled electron beam source is utilized to project electrons toward a substrate to form a waveguide which includes angled gratings. Further aspects of the disclosure provide for methods of forming angled gratings on waveguides utilizing an angled ion beam source and an angled electron beam source.

15 Claims, 8 Drawing Sheets

Related U.S. Application Data (60) Provisional application No. 62/780,805, filed on Dec. 17, 2018, provisional application No. 62/780,792, filed on Dec. 17, 2018.

(51) Int. Cl.

| | | |
|---|---|---|
| *G02B 6/13* | (2006.01) | |
| *H01L 21/3065* | (2006.01) | |
| *G02B 5/18* | (2006.01) | |
| *H01J 37/05* | (2006.01) | |
| *G02B 6/12* | (2006.01) | |
| *G02B 6/124* | (2006.01) | |
| *G06T 19/00* | (2011.01) | |
| *H01J 37/073* | (2006.01) | |
| *H01J 37/304* | (2006.01) | |
| *H01J 37/147* | (2006.01) | |

(52) U.S. Cl.
CPC .... *H01J 37/32422* (2013.01); *H01L 21/3065* (2013.01); *G02B 6/124* (2013.01); *G02B 6/12007* (2013.01); *G02B 2006/12176* (2013.01); *G06T 19/006* (2013.01); *H01J 37/05* (2013.01); *H01J 37/073* (2013.01); *H01J 37/1472* (2013.01); *H01J 37/3045* (2013.01); *H01J 37/32449* (2013.01); *H01J 2237/303* (2013.01); *H01J 2237/334* (2013.01)

(56) References Cited

U.S. PATENT DOCUMENTS

| | | | |
|---|---|---|---|
| 5,858,450 | A | 1/1999 | Fujimura et al. |
| 9,257,295 | B2 | 2/2016 | Singh et al. |
| 9,478,399 | B2 | 10/2016 | Likhanskii et al. |
| 9,812,349 | B2 | 11/2017 | Angelov et al. |
| 10,141,161 | B2 | 11/2018 | Gilchrist et al. |
| 10,224,221 | B2 | 3/2019 | Singh et al. |
| 10,431,459 | B2 | 10/2019 | Lee et al. |
| 2002/0014597 | A1 | 2/2002 | Koh et al. |
| 2005/0230353 | A1 | 10/2005 | Danziger |
| 2006/0236931 | A1 | 10/2006 | Singh et al. |
| 2008/0317968 | A1 | 12/2008 | Singh et al. |
| 2010/0282413 | A1 | 11/2010 | Nolan et al. |
| 2012/0196430 | A1 | 8/2012 | Riordon et al. |
| 2015/0011093 | A1 | 1/2015 | Singh et al. |
| 2016/0027646 | A1 | 1/2016 | Wu et al. |
| 2016/0035539 | A1 | 2/2016 | Sainiemi et al. |
| 2016/0064260 | A1 | 3/2016 | Berry, III et al. |
| 2016/0276134 | A1 | 9/2016 | Collins et al. |
| 2018/0076007 | A1 | 3/2018 | Gilchrist et al. |
| 2018/0158643 | A1 | 6/2018 | Park |
| 2018/0340769 | A1 | 11/2018 | Evans et al. |
| 2018/0348429 | A1 | 12/2018 | Young et al. |

FOREIGN PATENT DOCUMENTS

| | | |
|---|---|---|
| EP | 2418674 A2 | 2/2012 |
| JP | 2006-190970 A | 7/2006 |
| TW | 201500841 A | 1/2015 |
| WO | 2015-167682 A1 | 11/2015 |

OTHER PUBLICATIONS

International Search Report and Written Opinion for International Application No. PCT/US2019/066797 dated Apr. 16, 2020.
International Search Report and Written Opinion for International Application No. PCT/US2019/066780 dated Apr. 17, 2020.
International Search Report and Written Opinion for International Application No. PCT/US2019/066806 dated Apr. 16, 2020.
International Search Report and Written Opinion for International Application No. PCT/US2019/066789 dated Apr. 16, 2020.
Notice of Allowance for U.S. Appl. No. 16/716,954 dated Aug. 24, 2020.
Taiwan Office Action issued to Application No. 108146266 dated Dec. 24, 2020.

METHODS OF OPTICAL DEVICE FABRICATION USING AN ELECTRON BEAM APPARATUS

CROSS-REFERENCE TO RELATED APPLICATIONS

This application is a continuation of U.S. patent application Ser. No. 16/716,954, filed Dec. 17, 2019, which claims benefit of U.S. provisional patent application Ser. No. 62/780,805, filed Dec. 17, 2018, and U.S. provisional patent application Ser. No. 62/780,792, filed Dec. 17, 2018, all of which are herein incorporated by reference in their entirety.

BACKGROUND

Field

Embodiments of the disclosure generally relate to apparatus and methods for optical device fabrication. More specifically, embodiments of the disclosure relate to apparatus and methods for ion beam and electron beam waveguide fabrication.

Description of the Related Art

Virtual reality is generally considered to be a computer generated simulated environment in which a user has an apparent physical presence. A virtual reality experience can be generated in three dimensions (3D) and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlayed on an ambient environment. Waveguides are used to assist in overlaying images. Generated light propagates through a waveguide until the light exits the waveguide and is overlayed on the ambient environment. Fabricating waveguides can be challenging as waveguides tend to have non-uniform properties. Accordingly, what is needed in the art are improved methods and systems of waveguide fabrication

SUMMARY

In one embodiment, a waveguide fabrication method is provided. The method includes positioning a substrate on a pedestal in a process volume of a chamber and positioning the pedestal opposite a segmented surface of an electrode. The segmented surface includes a plurality of angled surfaces and electrons are projected from the segmented surface of the electrode toward the substrate at one or more non-normal angles to form angled fins on the substrate.

In another embodiment, a waveguide fabrication method is provided. The method includes positioning a substrate on a pedestal in a process volume of a chamber and positioning the pedestal opposite a segmented surface of an electrode. The segmented surface includes a plurality of angled surfaces having a substantially uniform morphology. A plasma is generated in the process volume and electrons are projected from the segmented surface of the electrode toward the substrate at one or more non-normal angles to form angled fins on the substrate.

In yet another embodiment, a waveguide fabrication method is provided. The method includes positioning a substrate on a pedestal in a process volume of a chamber and positioning the pedestal opposite a segmented surface of an electrode. The segmented surface includes a plurality of angled surfaces having different morphologies and differing in at least one of size, shape, spacing, density, or distribution across the segmented surface. A plasma is generated in the process volume and electrons are projected from the segmented surface of the electrode toward the substrate at one or more non-normal angles to form angled fins on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects of the disclosure relate to apparatus for the fabrication of nanostructured optical devices, such as waveguides, waveguide combiners, angled gratings, and metal-enses, for use in a variety of devices, such as headsets for augmented reality/virtual reality (AR/VR) and smart windows. In one example, an angled ion source is utilized to project ions toward a substrate to form a waveguide which includes angled gratings. In another example, an angled electron beam source is utilized to project electrons toward a substrate to form a waveguide which includes angled gratings. Further aspects of the disclosure provide for methods of forming angled gratings on waveguides utilizing an angled ion beam source and an angled electron beam source.

Figure 1:
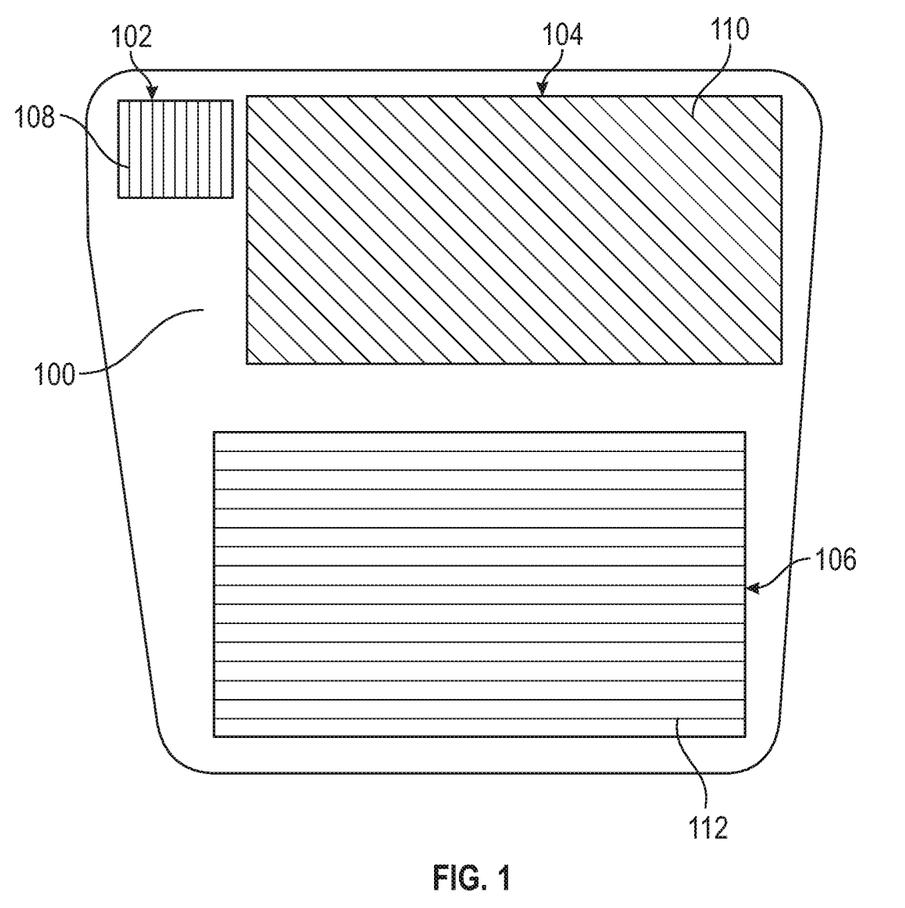
FIG. 1 illustrates a plan view of a waveguide combiner according to an embodiment of the disclosure.

FIG. 1 illustrates a plan view of a waveguide combiner 100 according to an embodiment of the disclosure. It is to be understood that the waveguide combiner 100 described below is an exemplary waveguide combiner and other waveguide combiners having different designs may benefit from the embodiments described herein. The waveguide combiner 100 includes an input coupling region 102 defined by a plurality of gratings 108, an intermediate region 104 defined by a plurality of gratings 110, and an output coupling region 106 defined by a plurality of gratings 112. The input coupling region 102 receives incident beams of light (a virtual image) having an intensity from a microdisplay. Each grating, such as a fin structure or the like, of the plurality of gratings 108 splits the incident beams into a plurality of modes, each beam having a mode. Zero-order mode (T0) beams are reflected back or transmitted through the waveguide combiner 100, positive first-order mode (T1) beams are coupled though the waveguide combiner 100 to the intermediate region 104, and negative first-order mode (T-1) beams propagate in the waveguide combiner 100 a direction opposite to the T1 beams. Ideally, the incident beams are split into T1 beams that have all of the intensity of the incident beams in order to direct the virtual image to the intermediate region 104. One approach to split the incident beam into T1 beams that have all of the intensity of the incident beams is to utilize fins, which comprise the gratings 108, having a slant angle to suppress the T-1 beams and the T0 beams. The T1 beams undergo total-internal-reflection (TIR) through the waveguide combiner 100 until the T1 beams come in contact with the plurality of gratings 110 in the intermediate region 104. A portion of the input coupling region 102 may have gratings 108 with a slant angle different than the slant angle of gratings 108 from an adjacent portion of the input coupling region 102.

The T1 beams contact a fin of the plurality of gratings 110. The T1 beams are split into T0 beams refracted back or lost in the waveguide combiner 100, T1 beams that undergo TIR in the intermediate region 104 until the T1 beams contact another fin of the plurality of gratings 110, and T-1 beams that are coupled through the waveguide combiner 100 to the output coupling region 106. The T1 beams that undergo TIR in the intermediate region 104 continue to contact gratings of the plurality of gratings 110 until the either the intensity of the T1 beams coupled through the waveguide combiner 100 to the intermediate region 104 is depleted, or remaining T1 beams propagating through the intermediate region 104 reach the end of the intermediate region 104.

The plurality of gratings 110 are tuned to control the T1 beams coupled through the waveguide combiner 100 to the intermediate region 104 to control the intensity of the T-1 beams coupled to the output coupling region 106 to modulate a field of view of the virtual image produced from the microdisplay from a user's perspective and increase a viewing angle from which a user can view the virtual image. One approach to control the T1 beams coupled through the waveguide combiner 100 to the intermediate region 104 is to optimize the slant angle of each fin of the plurality of gratings 110 to control the intensity of the T-1 beams coupled to the output coupling region 106. A portion of the intermediate region 104 may have gratings 110 with a slant angle different than the slant angle of gratings 110 from an adjacent portion of the intermediate region 104. Furthermore, the gratings 110 may have fins with slant angles different than the slant angles of fins of the gratings 108.

The T-1 beams coupled through the waveguide combiner 100 to the output coupling region 106 undergo TIR in the waveguide combiner 100 until the T-1 beams contact a grating of the plurality of gratings 112 where the T-1 beams are split into T0 beams refracted back or lost in the waveguide combiner 100. T1 beams that undergo TIR in the output coupling region 106 until the T1 beams contact another fin of the plurality of gratings 112 and T-1 beams coupled out of the waveguide combiner 100. The T1 beams that undergo TIR in the output coupling region 106 continue to contact fins of the plurality of gratings 112 until either the intensity of the T-1 beams coupled through the waveguide combiner 100 to the output coupling region 106 is depleted or remaining T1 beams propagating through the output coupling region 106 have reached the end of the output coupling region 106. The plurality of gratings 112 are tuned to control the T-1 beams coupled through the waveguide combiner 100 to the output coupling region 106 in order to control the intensity of the T-1 beams coupled out of the waveguide combiner 100 to further modulate the field of view of the virtual image produced from the microdisplay from the user's perspective and further increase the viewing angle from which the user can view the virtual image.

One approach to control the T-1 beams coupled through the waveguide combiner 100 to the output coupling region 106 is to optimize the slant angle of each fin of the plurality of gratings 112 to further modulate the field of view and increase the viewing angle. A portion of the intermediate region 104 may have gratings 110 with a fin slant angle different than the slant angle of fins of the gratings 110 from an adjacent portion of the intermediate region 104. Furthermore, the gratings 112 may have fin slant angles different that the fin slant angles of the gratings 108 and the gratings 110.

Figure 2:
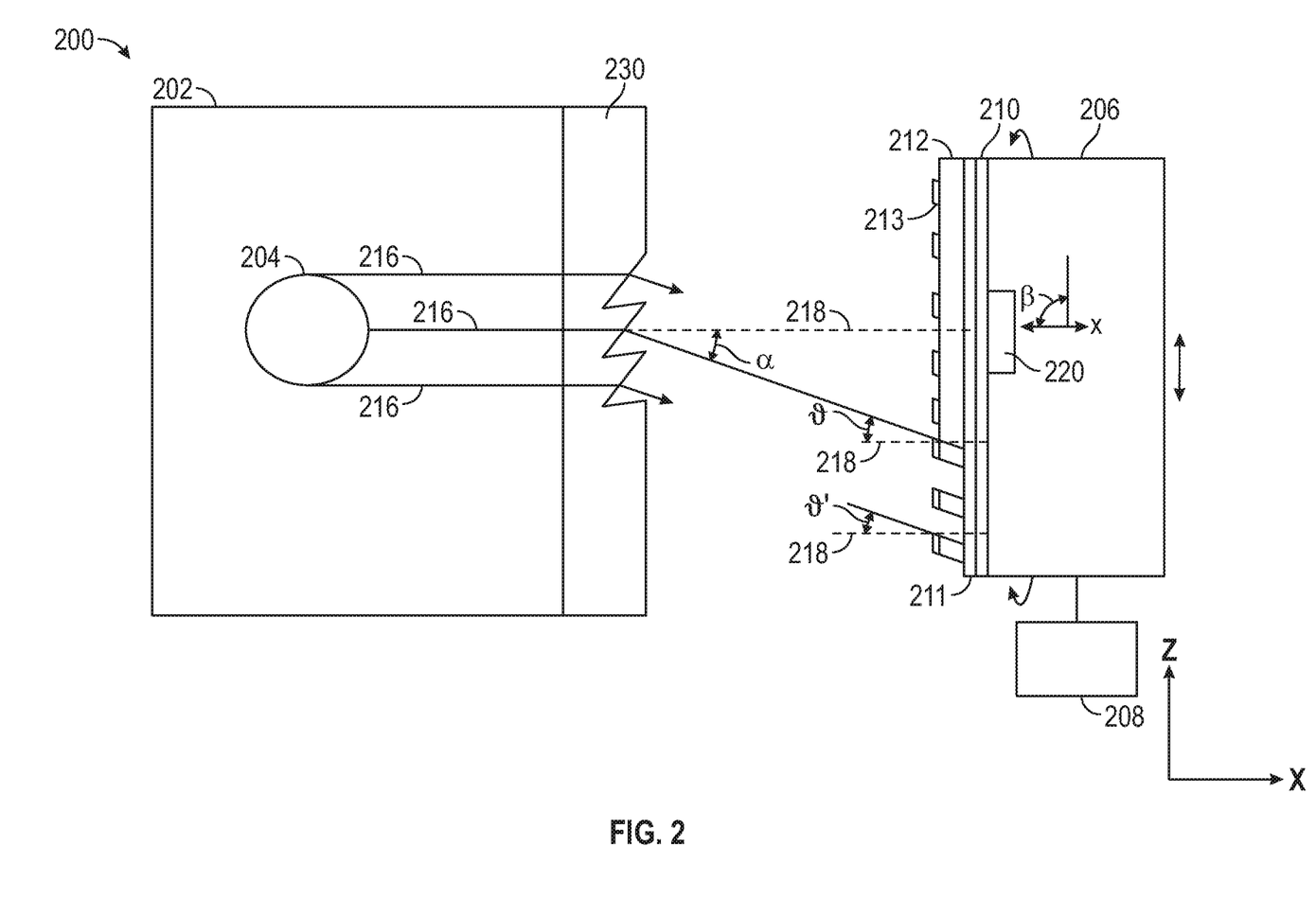
FIG. 2 illustrates a schematic side view of an angled etch system according to an embodiment of the disclosure.

FIG. 2 illustrates a schematic side view of an angled etch system 200 according to an embodiment of the disclosure. It is to be understood that the angled etch system 200 described below is an exemplary angled etch system and other angled etch systems may be used with or modified to fabricate waveguide combiners in accordance with the embodiments of the disclosure.

To form fins having slant angles, a grating material 212 disposed on a substrate 210 is etched by the angled etch system 200. In one embodiment, the grating material 212 is disposed on an etch stop layer 211 disposed on the substrate 210 and a patterned hardmask 213 is disposed over the grating material 212. The materials of grating material 212 are selected based on the slant angle $\vartheta'$ of each fin and the refractive index of the substrate 210 to control the in-coupling and out-coupling of light and facilitate light propagation through a waveguide combiner. In another embodiment, the grating material 212 includes silicon oxycarbide (SiOC), titanium dioxide (TiO$_2$), silicon dioxide (SiO2), vanadium (IV) oxide (VOx), aluminum oxide (Al$_2$O$_3$), indium tin oxide (ITO), zinc oxide (ZnO), tantalum pentoxide (Ta$_2$O$_5$), silicon nitride (Si$_3$N$_4$), titanium nitride (TiN), and/or zirconium dioxide (ZrO$_2$) containing materials. The grating material 212 has a refractive index between about 1.5 and about 2.65.

In another embodiment, which may be combined with other embodiments described herein, the patterned hardmask 213 is a non-transparent hardmask that is removed after the waveguide combiner is formed. For example, the non-transparent hardmask includes reflective materials, such as chromium, silver, titanium nitride, tantalum nitride, silicon nitride, or silicon oxide materials. In another embodiment, the patterned hardmask 213 is a transparent hardmask. In one embodiment, which may be combined with other embodiments described herein, the etch stop layer 211 is a non-transparent etch stop layer that is removed after the waveguide combiner is formed. In another embodiment, which may be combined with other embodiments described herein, the etch stop layer 211 is a transparent etch stop layer.

The angled etch system 200 includes an ion beam chamber 202 that houses an ion beam source 204. The ion beam source 204 is configured to generate an ion beam 216, such as a spot beam, a ribbon beam, or a full substrate-size beam. The ion beam chamber 202 is configured to direct the ion beam 216 at an angle α relative to a datum plane 218 oriented normal to the substrate 210. For example, the system 200 also includes a segmented source 230. The segmented source 230 modulates the angle of the ion beam 216 to achieve the angle α utilized to fabricate the fins in the grating material 212. The segmented source 230, which may include a plurality of segments, each including one or more electrodes, is described in detail with regard to FIG. 3 and FIGS. 4A-4C.

The substrate 210 is retained on a platen 206 coupled to a first actuator 208. The first actuator 208, which may be a linear actuator, a rotary actuator, a stepper motor, or the like, is configured to move the platen 206 in a scanning motion along a y-direction and/or a z-direction. In one embodiment, the first actuator 208 is further configured to tilt the platen 206 such that the substrate 210 is positioned at a tilt angle β relative to the x-axis of the ion beam chamber 202. The angle α and tilt angle β result in an ion beam angle θ relative to the datum plane 218. To form fins having a slant angle θ' relative the datum plane 218, the ion beam source 204 generates an ion beam 216 and the ion beam chamber 202 directs the ion beam 216 through the segmented source 230 towards the substrate 210 at the angle α. The first actuator 208 positions the platen 206 so that the ion beam 216 contacts the grating material 212 at the ion beam angle θ and etches fins having a slant angle θ' on desired portions of the grating material 212. A second actuator 220 may also be coupled to the platen 206 to rotate the substrate 210 about the x-axis of the platen 206 to control the slant angle θ' of gratings. Advantageously, various different regions of the substrate 210 may be exposed to the ion beam 216 by rotating the substrate 210 without otherwise changing apparatus of the ion beam chamber 202.

Figure 3:
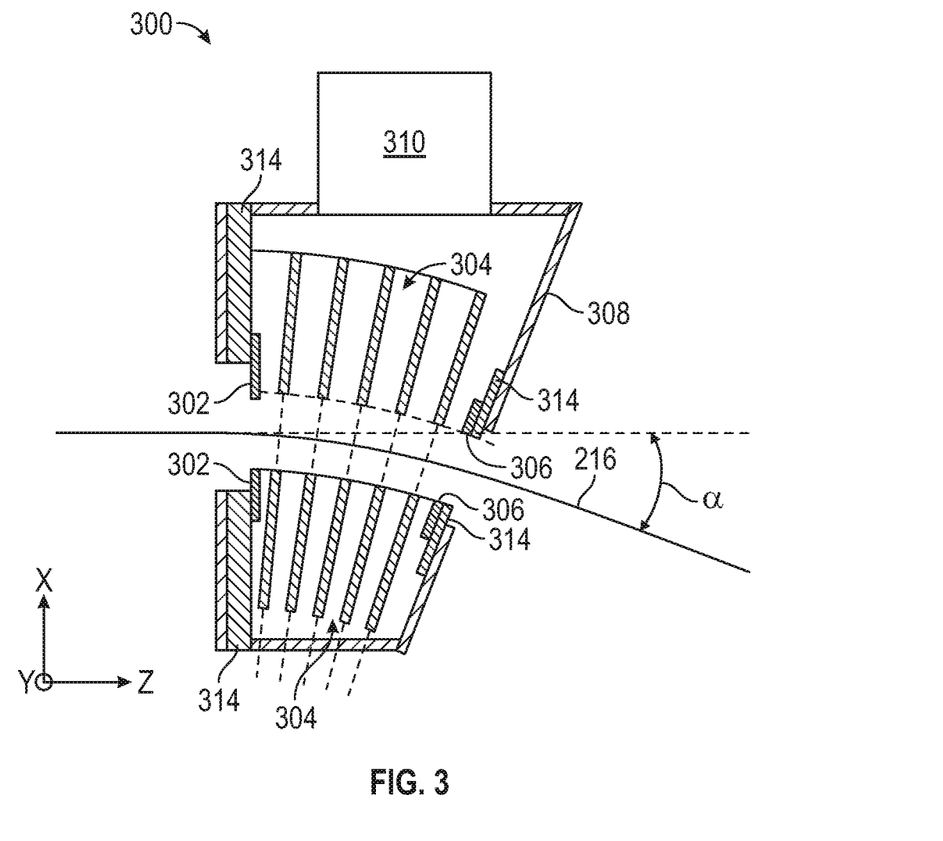
FIG. 3 illustrates a side sectional view of an electrode assembly according to an embodiment of the disclosure.

FIG. 3 illustrates a side sectional view of an electrode assembly 300 according to an embodiment of the disclosure. In one embodiment, the electrode assembly 300 may be adapted as a graded lens configuration. In another embodiment, which may be combined with other embodiments, the electrode assembly 300 includes one or more assemblies of electrodes. For example, the electrode assembly 300 may include a set of entrance electrodes 302, one or more sets of suppression electrodes 304 (or focusing electrodes), and a set of exit electrodes 306. The exit electrodes 306 may be referred to as ground electrodes. Each set of electrodes 302, 304, 306 may be positioned with a space or gap to enable passage or an ion beam 216 (e.g., a ribbon beam, a spot beam, or full substrate-size beam) therethrough.

In some embodiments, the entrance electrodes 302, the suppression electrodes 304, and the exit electrodes 306 are be provided in a housing 308. A pump 310 may be directly or indirectly connected to the housing 308. The pump 310 may be a vacuum pump for providing a high-vacuum environment or other controlled environment of a different pressure. For example, the pump 310 may generate a sub-atmospheric pressure environment within the housing 308 or the pump 310 may maintain an approximately atmospheric pressure environment within the housing 308. In other embodiments, which may be combined with other embodiments, the housing 308 may include one or more dielectric members 314. The dielectric members 314 function to electrically isolate the housing 308 from other components of the electrode assembly 300.

The set of entrance electrodes 302 and exit electrodes 306 may include two conductive pieces electrically coupled to each other. In other embodiments, the assembly of entrance electrodes 302 are a single-piece structure with an aperture for the ion beam 216 to pass therethrough. In some embodiments, upper and lower portions of suppression electrodes 304 may have different potentials (e.g., in separate/discreet conductive portions) in order to deflect the ion beam 216 passing therethrough. Although the electrode assembly 300 is depicted as a seven (7) element lens configuration (e.g., with five (5) sets of suppression electrodes 304), it should be appreciated that any number of elements (or electrodes) may be utilized. For example, in some embodiments, the electrode assembly 300 may utilize a range of three (3) to ten (10) electrode sets.

Electrostatic focusing of the ion beam 216 may be achieved by using several thin electrodes (e.g., the suppression electrodes 304) to control grading of potential along a path the ion beam 216. As a result, the use of input ion beams 216 may be used in an energy range, such as 100 Volts to 3,000 Volts, that may enable higher-quality beams, even for very low energy output beams. In one embodiment, as the ion beam 216 passes through the electrodes of the electrode assembly 300, the ion beam 216 may be decelerated from 6 keV to 0.2 keV and deflected at about 15 degrees to about 30 degrees, or greater, by the electrodes of the electrode assembly 300. In one example, the energy ratio may be 30/1.

It should be appreciated that separating and independently controlling deceleration, deflection, and/or focus may be accomplished by one or a combination of moving the electrodes (e.g., the entrance electrode 302, suppression electrodes 304, and the exit electrode 306) with respect to a central ray trajectory (e.g. the datum plane 218 of FIG. 2) of the ion beam 216, and varying deflection voltages electrodes (e.g., the entrance electrode 302, suppression electrodes 304, and the exit electrode 306) along the central ray trajectory of the ion beam 216 to reflect beam energy at each point along the central ray trajectory at a deflection angle α. The symmetry of the electrodes with respect to the central ray trajectory of the ion beam 216 is where the ends of upper and lower electrodes closest to the ion beam 216 may be maintained at equal (or near-equal) perpendicular distances from the central ray trajectory of the ion beam 216. For example, a difference in voltages on electrodes above and below the ion beam 216 may be configured so that a deflection component of the electric field may be a fixed ratio/factor of the beam energy at that point (which may vary along the electrodes or lenses).

Figure 4A:
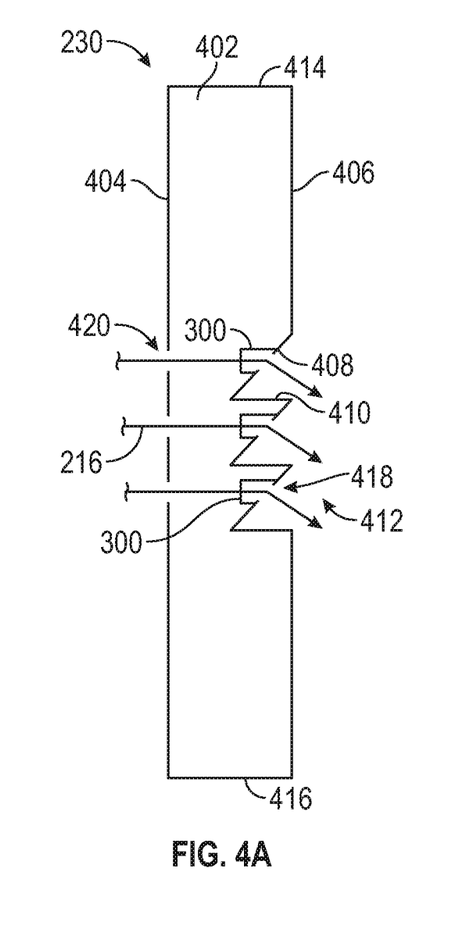
FIG. 4A illustrates a schematic side view of a segmented ion source according to an embodiment of the disclosure.

FIG. 4A illustrates a schematic side view of a segmented ion source 230 according to an embodiment of the disclosure. The segmented ion source 230 is coupled to or otherwise integrated with the ion beam chamber 202 and segments 412 of the segmented ion source 230 are aligned or otherwise positioned to receive the ion beam 216 from the beam source 204.

The segmented ion source 230 includes a housing 402 having a first wall 404, a second wall 406, a third wall 414, and a fourth wall 416. In one embodiment, the first wall 404 and second wall 406 are oriented substantially parallel to one another. The third wall 414 and fourth wall 416 are also substantially parallel to one another and extend between the first wall 404 and the second wall 406. While the above-described orientation of walls 404, 406, 414, 416 may be beneficially employed, it is contemplated that other wall configurations may be utilized.

In one embodiment, the first wall 404 is coupled to the ion beam chamber 202 and the segments 412 are positioned adjacent to and opposite the platen 206. The segments 412 are formed in the second wall 406 and include a plurality of surfaces 408, 410. A first surface 408 is angled relative to a datum plane defined by the second wall 406. The angle of the first surface 408 may be selected between about 1 degree and about 60 degrees from the datum plane defined by the second wall 406. Thus, the first surface 408 extends from the second wall 406 and an angle into the housing 402 and toward the first wall 404.

A second surface 410 extends between the first surface 408 and the second wall 406. The second surface 410 is oriented substantially normal to the datum plane defined by the second wall 406. However, it is contemplated that the second surface 410 may be oriented at non-normal angles with respect to the datum plane defined by the second wall 406. While three segments 412 are illustrated, it is contemplated that a greater or lesser number of segments 412 may be utilized to modulate the ion beam 216 depending upon the area of the substrate 210 desired to be etched. Additionally, it is contemplated that the magnitude of the surfaces 408, 410 may be changed relative to one another to modulate angle characteristics of the ion beam 216.

In one embodiment, the electrode assembly 300 is positioned within the housing 402 adjacent to the first surface 408 of the second wall 406. For example, the electrode assembly 300 may be coupled to the first surface 408 within the housing 402. As depicted in in FIG. 3, the housing 308 of the electrode assembly 300 may include a shape selected to match or interface with the angle of the first surface 408. The first surface 408 may also include one or more openings 418 therein adjacent to where the electrode assembly 300 is positioned to enable the ion beam 216 to pass through the first surface 408. Similarly, the first wall 404 may also have one or more openings 420 formed therein and the openings 420 formed in the first wall 404 may be aligned with one or both of the openings 418 formed in the first surface 408 or the electrode assembly 300. Accordingly, the ion beam 216 may propagate through the first wall 404 at an orientation substantially normal to a datum plane defined by the first wall 404 but exit the housing 402 through the first surface 408 of the second wall 406 at a predetermined angle.

Figure 4B:
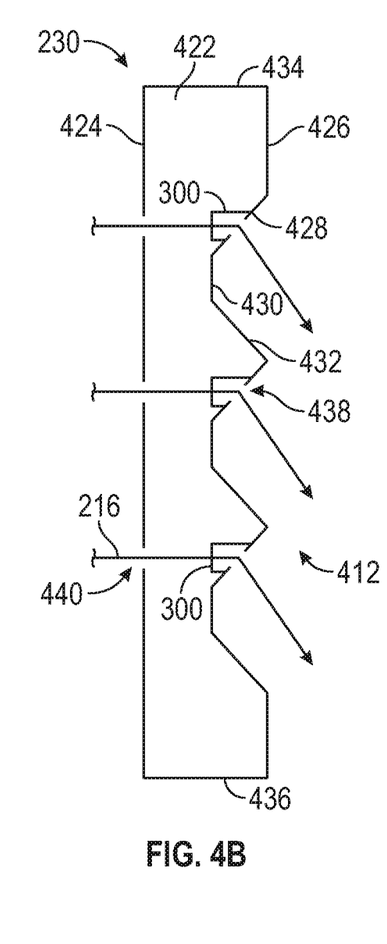
FIG. 4B illustrates a schematic side view of a segmented ion source according to an embodiment of the disclosure.

FIG. 4B illustrates a schematic side view of a segmented ion source 230 according to an embodiment of the disclosure. The segmented ion source 230 is coupled to or otherwise integrated with the ion beam chamber 202 and segments 412 of the segmented ion source 230 are aligned or otherwise positioned to receive the ion beam 216 from the beam source 204.

The segmented ion source 230 includes a housing 422 having a first wall 424, a second wall 426, a third wall 434, and a fourth wall 436. In one embodiment, the first wall 424 and second wall 426 are oriented substantially parallel to one another. The third wall 434 and fourth wall 436 are also substantially parallel to one another and extend between the first wall 424 and the second wall 426. While the above-described orientation of walls 424, 426, 434, 436 may be beneficially employed, it is contemplated that other wall configurations may be utilized.

In one embodiment, the first wall 424 is coupled to the ion beam chamber 202 and the segments 412 are positioned adjacent to and opposite the platen 206. The segments 412 are formed in the second wall 426 and include a plurality of surfaces 428, 430, 432. A first surface 428 is angled relative to a datum plane defined by the second wall 426. The angle of the first surface 428 may be selected between about 1 degree and about 60 degrees from the datum plane defined by the second wall 426. Thus, the first surface 428 extends from the second wall 426 and an angle into the housing 422 and toward the first wall 424.

A second surface 430 extends between the first surface 428 and a third surface 432. The second surface 430 is oriented substantially parallel to the datum plane defined by the second wall 426. However, it is contemplated that the second surface 430 may be oriented at non-parallel angles with respect to the datum plane defined by the second wall 426. The third surface 432 extends from the second surface 430 to the second wall 426 at an adjacent first surface 428. The third surface 432 is angled with respect to the datum plan defined by the second wall 426. In one example, the angle of the third surface 432 is substantially similar to the angle of the first surface 428. Alternatively, the angle of the third surface 432 may be different from the angle of the first surface 428. The magnitude of the second surface 430 spaces the third surface 432 from the first surface 428. Accordingly, it is contemplated that the first surface 428 may be oriented at a wider range of angles to enable angled etching of the substrate 210. Additionally, the spacing and orientation of the third surface 432 from the first surface 428 is believed to enable a larger area of the substrate 210 to be processed at a time. While three segments 412 are illustrated, it is contemplated that a greater or lesser number of segments 412 may be utilized to modulate the ion beam 216 depending upon the area of the substrate 210 desired to be etched. It is also contemplated that the magnitude of the surfaces 428, 430, 432 may be changed relative to one another to modulate angle characteristics of the ion beam 216.

In one embodiment, the electrode assembly 300 is positioned within the housing 422 adjacent to the first surface 428 of the second wall 426. For example, the electrode assembly 300 may be coupled to the first surface 428 within the housing 422. As depicted in in FIG. 3, the housing 308 of the electrode assembly 300 may include a shape selected to match or interface with the angle of the first surface 428. The first surface 428 may also include one or more openings 438 therein adjacent to where the electrode assembly 300 is positioned to enable the ion beam 216 to pass through the first surface 428. Similarly, the first wall 424 may also have one or more openings 440 formed therein and the openings 440 formed in the first wall 424 may be aligned with one or both of the openings 438 formed in the first surface 428 or the electrode assembly 300. Accordingly, the ion beam 216 may propagate through the first wall 424 at an orientation substantially normal to a datum plane defined by the first wall 424 but exit the housing 422 through the first surface 428 of the second wall 426 at a predetermined angle.

Figure 4C:
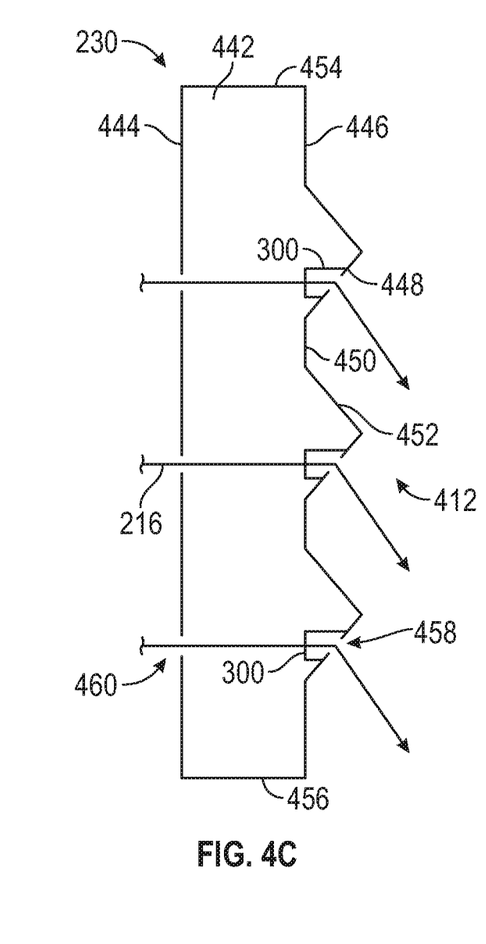
FIG. 4C illustrates a schematic side view of a segmented ion source according to an embodiment of the disclosure.

FIG. 4C illustrates a schematic side view of a segmented ion source 230 according to an embodiment of the disclosure. The segmented ion source 230 is coupled to or otherwise integrated with the ion beam chamber 202 and segments 412 of the segmented ion source 230 are aligned or otherwise positioned to receive the ion beam 216 from the beam source 204.

The segmented ion source 230 includes a housing 442 having a first wall 444, a second wall 446, a third wall 454, and a fourth wall 456. In one embodiment, the first wall 444 and second wall 446 are oriented substantially parallel to one another. The third wall 454 and fourth wall 456 are also substantially parallel to one another and extend between the first wall 444 and the second wall 446. While the above-described orientation of walls 444, 446, 454, 456 may be beneficially employed, it is contemplated that other wall configurations may be utilized.

In one embodiment, the first wall 444 is coupled to the ion beam chamber 202 and the segments 412 are positioned adjacent to and opposite the platen 206. The segments 412 are formed in the second wall 446 and include a plurality of surfaces 448, 450, 452. A first surface 428 is angled relative to a datum plane defined by the second wall 446. The angle of the first surface 448 may be selected between about 1 degree and about 60 degrees from the datum plane defined by the second wall 446.

A second surface 450 extends between the first surface 448 and a third surface 452. The second surface 450 is oriented substantially parallel to the datum plane defined by the second wall 446. However, it is contemplated that the second surface 450 may be oriented at non-parallel angles with respect to the datum plane defined by the second wall 446. The third surface 452 extends from the second wall 446 at a non-normal angle relative to the datum plane defined by the second wall 446. In this embodiment, the third surface 452 extends from the second wall 446 at an angle out of the housing 422 and away the first wall 444. Alternatively, the third surface 452 may extend from the second wall 446 at an angle normal to the datum plane defined by the second wall 446.

In one example, the angle of the third surface 452 is substantially similar to the angle of the first surface 448. Alternatively, the angle of the third surface 452 may be different from the angle of the first surface 448. The magnitude of the second surface 450 spaces the third surface 452 from the first surface 448. Accordingly, it is contemplated that the first surface 448 may be oriented at a wider range of angles to enable angled etching of the substrate 210. Additionally, the spacing and orientation of the third surface 452 from the first surface 448 is believed to enable a larger area of the substrate 210 to be processed at a time. While three segments 412 are illustrated, it is contemplated that a greater or lesser number of segments 412 may be utilized to modulate the ion beam 216 depending upon the area of the substrate 210 desired to be etched. It is also contemplated that the magnitude of the surfaces 448, 450, 452 may be changed relative to one another to modulate angle characteristics of the ion beam 216.

In one embodiment, the electrode assembly 300 is positioned within the housing 442 adjacent to the first surface 448 of the second wall 446. For example, the electrode assembly 300 may be coupled to the first surface 448 within the housing 442. As depicted in in FIG. 3, the housing 308 of the electrode assembly 300 may include a shape selected to match or interface with the angle of the first surface 448. The first surface 448 may also include one or more openings 458 therein adjacent to where the electrode assembly 300 is positioned to enable the ion beam 216 to pass through the first surface 448. Similarly, the first wall 444 may also have one or more openings 460 formed therein and the openings 460 formed in the first wall 444 may be aligned with one or both of the openings 458 formed in the first surface 448 or the electrode assembly 300. Accordingly, the ion beam 216 may propagate through the first wall 444 at an orientation substantially normal to a datum plane defined by the first wall 444 but exit the housing 442 through the first surface 448 of the second wall 446 at a predetermined angle.

The segmented ion source 230 coupled to the ion beam chamber 202 utilizes the segments 412 and electrode assembly 300 to modulate the angle of the ion beam 216 generated by the beam source 204. The segments 412 and electrode assembly 300 may be positioned or otherwise oriented in a manner to enable angled etching of the substrate 210. It is contemplated that the segmented ion source 230 may be modular in nature and different segmented ion sources may be interchanged on the ion beam chamber 202 to facilitate different angled etching profiles of the substrate 210. The segmented ion source 230 may also be utilized to reduce processing complexity associated with movement of the platen 206 by reducing variables associated with movement of the platen 206 by the actuators 208, 220. The segmented ion source 230 may also be utilized in combination with movement of the platen 206 via the actuators 208, 220 to enable more complex or precise angled etching profiles of the substrate 210.

Figure 5A:
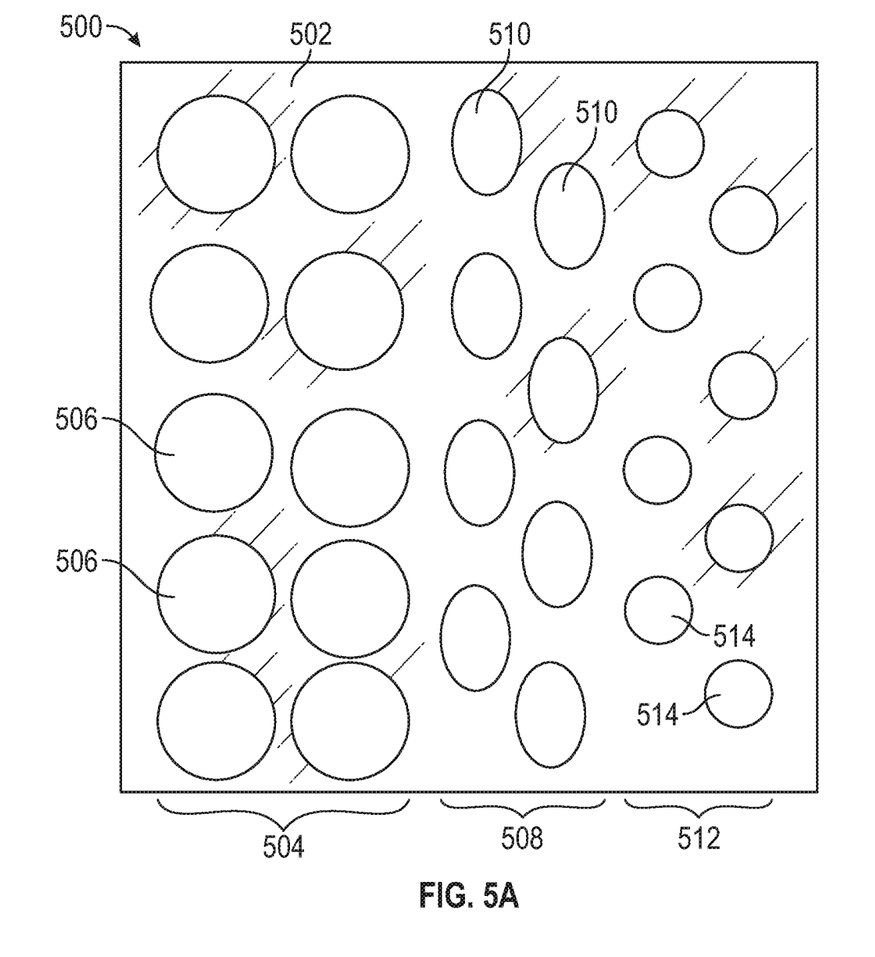
FIG. 5A illustrates a schematic plan view of a filter plate according to an embodiment of the disclosure.
Figure 5B:
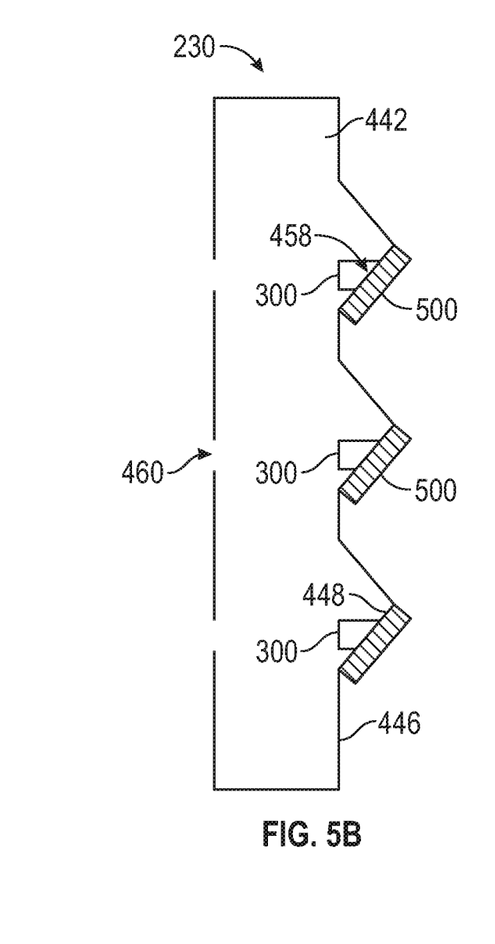
FIG. 5B illustrates a schematic side view of the segmented ion source of FIG. 4C with filter plates coupled thereto according to an embodiment of the disclosure.

FIG. 5A illustrates a schematic, plan view of a filter plate 500 according to an embodiment of the disclosure. FIG. 5B illustrates a schematic side view of the segmented ion source 230 of FIG. 3C with filter plates 500 coupled thereto according to an embodiment of the disclosure. The filter plate 500 is adapted to interface with and couple to the segmented ion source 230 to modulate the intensity or distribution of the ion beam 216 passing through the filter plate 500.

The filter plate 500 includes a body 502 having a plurality of apertures 506, 510, 514 formed therein. The body 502 is fabricated from a material of sufficient thickness which is resistant or inert to ion beam bombardment and prevents ions from passing threrethrough. The apertures 506, 510, 514 extend through the body 502 to form openings through which the ion beam 216 passes. A first region 504 of the body 502 includes a first plurality of apertures 506. Although the first region 504 is illustrated as occupying approximately one third of the body 502, it is contemplated that the first region 504 may include a greater or lesser portion of the body 502. The first plurality of apertures 506 are illustrated as being substantially circle-shaped with an approximately even distribution between adjacent apertures of the first plurality of apertures 506. However, any number, shape, orientation, spacing, or arrangement of the first plurality of apertures 506 may be utilized to modulate the intensity or distribution of the ion beam 216 passing through the first plurality of apertures 506.

A second region 508 of the body 502 includes a second plurality of apertures 510. Although the second region 508 is illustrated as occupying approximately one third of the body 502, it is contemplated that the second region 508 may include a greater or lesser portion of the body 502. The second plurality of apertures 510 are illustrated as being substantially oval-shaped with an approximately even distribution between adjacent apertures of the second plurality of apertures 510. However, any number, shape, orientation, spacing, or arrangement of the second plurality of apertures 510 may be utilized to modulate the intensity or distribution of the ion beam 216 passing through the second plurality of apertures 510.

A third region 512 of the body 502 includes a third plurality of apertures 514. Although the third region 512 is illustrated as occupying approximately one third of the body 502, it is contemplated that the third region 512 may include a greater or lesser portion of the body 502. The third plurality of apertures 514 are illustrated as being substantially circle-shaped with an approximately even distribution between adjacent apertures of the third plurality of apertures 514. However, any number, shape, orientation, spacing, or arrangement of the third plurality of apertures 514 may be utilized to modulate the intensity or distribution of the ion beam 216 passing through the third plurality of apertures 514.

In one example, the first plurality of apertures 506 occupy an area of the body 502 in the first region 504 which is greater than an area of either the second plurality of apertures 510 and/or the third plurality of apertures 514. In other words, the ion beam 216 passing through the first region 504 of the body 502 is less obstructed when compared to the second region 508 and/or the third region 512. Thus, the ion beam 216 passing through the first region 504 may contact a first region of the substrate 210 with a greater amount and intensity of ions. The second region 508 and third region 512 have different arrangements, spacing, and shapes of apertures 510, 514, respectively, and modulate the ion beam 216 passing threrethrough such that the amount and intensity of ions contacting the substrate 210 in second and third regions, respectively, are different from the amount and intensity of ions which were modulated by the first region 504.

In one example, an angled etching profile on the substrate 210 in a first region is generated by the ion beam 216 passing through the first plurality of apertures 506, an angled etching profile on the substrate 210 in a second region is generated by the ion beam 216 passing through the second plurality of apertures 510, and an angles etching profile on the substrate 210 in a third region is generated by the ion beam 216 passing through the third plurality of apertures 514. The different etching profiles of fins or gratings formed on the substrate are generated by the regions 514, 518, 518 of the filter plate 500. It is contemplated that various aperture designs, shapes, spacing, density, etc. incorporated in the filter plate 500 may be utilized to modulate the ion beam 216 characteristics and thus enable different angled etching profiles on a substrate while utilizing a single ion beam chamber 202 and/or ion beam source 204.

FIG. 5B illustrates a schematic side view of the segmented ion source 230 of FIG. 4C with filter plates 500 coupled thereto according to an embodiment of the disclosure. The filter plates 500 are coupled to the first surface 448 of the segmented ion source 230. The filter plates 500 may be coupled to the first surface 448 by mechanical fastening apparatus, such as bolts, screws, or the like, or may be integrated into the first surface 448 such that the first surface 448 and the filter plate 500 is a unitary structure. In one embodiment, the filter plates 500 are disposed at an angle relative to the datum plane defined by the second wall 446. The electrode assemblies 300 are disposed within the housing 442 adjacent to the first surface 448. The ion beam 216 entering the opening 460 is modulated, curved, or angled by the electrode assemblies 300 and the angled ion beam 216 passes through the opening 458 where the ion beam 216 is modulated in intensity and/or distribution by the filter plates 500. It is contemplated that the ion beam 216, which has been modulated by the filter plate 500, has a plurality of different characteristics which etch the substrate 210 differently depending upon which region 504, 508, 512 of the filter plate 500 the ion beam 216 passes through. Such different etching profiles and characteristics enabled by the filter plate 500 may be utilized to etch fins or gratings on the substrate 210 with different depths or other characteristics.

While the segmented ion source 230 of FIG. 4C is illustrated with the filter plates 500, it is contemplated that the filter plates 500 may be advantageously utilized in combination with the segmented ion source 230 of FIGS. 4A and 4B. For example, the filter plate 500 may be coupled to the first surface 408 of the segmented ion source 230 of FIG. 4A or the filter plate 500 may be coupled to the first surface 428 of the segmented ion source 230 of FIG. 4B. Depending upon the configuration of the segmented ion source 230, the filter plate 500 and the electrode assembly 300 may be disposed in various different orientations than those illustrated. For example, the electrode assembly 300 and filter plate 500 may be utilized on opposing sides of the third surfaces 432, 452 of the segmented ion source 230 of FIG. 4B and FIG. 4C, respectively.

Figure 6:
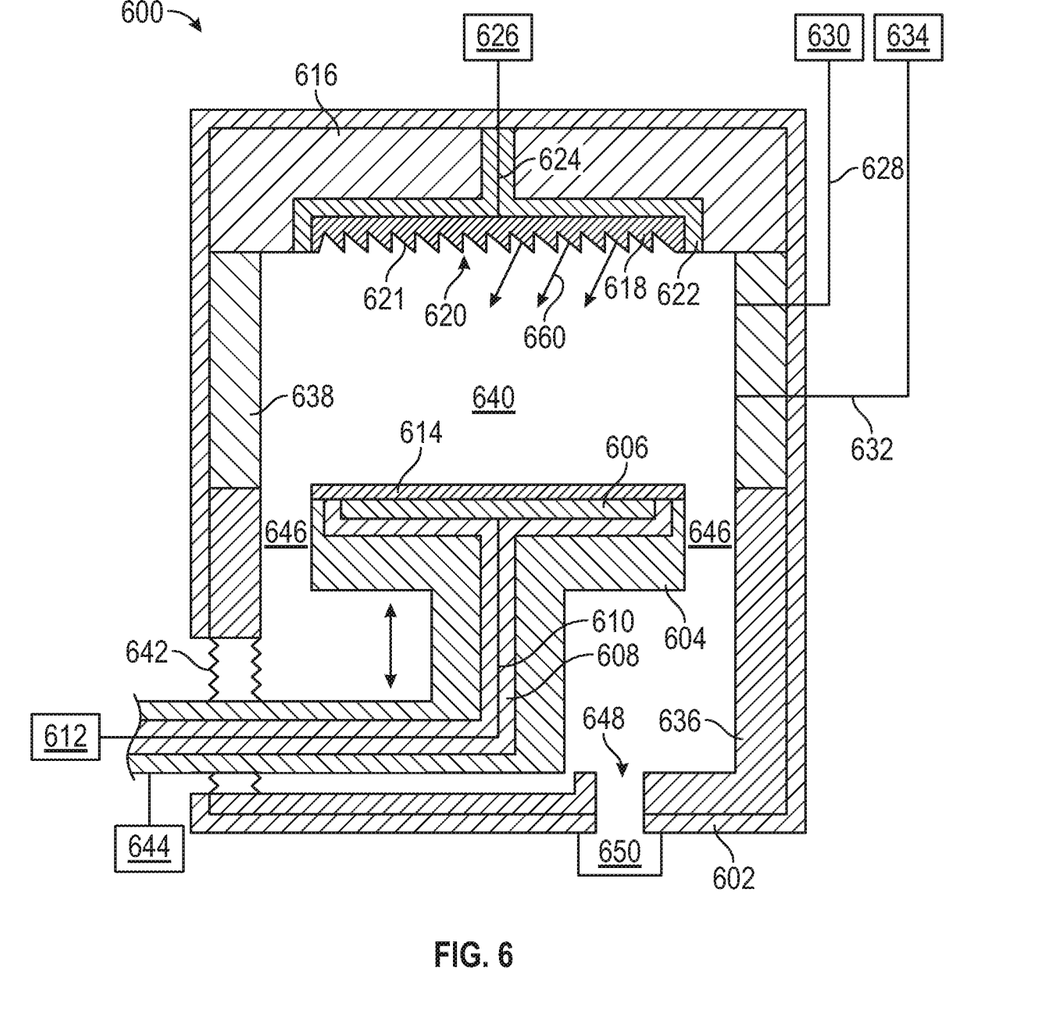
FIG. 6 illustrates a schematic cross-sectional view of an electron beam etching system according to an embodiment of the disclosure.

FIG. 6 illustrates a schematic, cross-sectional view of an electron beam etching system 600 according to an embodiment of the disclosure. One example of an electron beam etching system 600 is the SYM3™ apparatus available from Applied Materials, Inc., Santa Clara, Calif., which may be modified in accordance with various aspects of the disclosure. It is contemplated that other suitable apparatus from other manufacturers may also benefit from the embodiments described herein.

The system 600 includes a chamber body 602 which encloses or otherwise defines a process volume 640. The chamber body 602 may be fabricated from suitable materials such as stainless steel, aluminum, or alloys and combinations thereof. A first liner 636 is disposed adjacent to the chamber body 602 to protect the chamber body 602 from the processing environment of the process volume 640. In one example, the first liner 636 may be fabricated from process inert or resistant materials, such as a ceramic material or other suitable materials, for example, silicon containing material, carbon containing material, silicon carbon material, or silicon oxide containing materials.

A second liner 638 is also disposed adjacent to the chamber body 602 and the second liner 638 is positioned to substantially surround the process volume 640. In one embodiment, the second liner 638 is fabricated from a dielectric material, such as quartz or a ceramic material. In another embodiment, the second line 638 is fabricated from materials similar to those utilized to fabricate the first liner 636. The liners 636, 638 may also be coated with various materials similar to those utilized to fabricate the liners 636, 638 and may additionally be coated with materials such as aluminum oxide materials, yttrium oxide materials, or zirconium materials. In certain embodiments, one or both of the first liner 636 and the second liner 638 are optional. In such embodiments, the chamber body 602 may be fabricated and configured to function without liners.

An exhaust port 648 is formed through the second liner 636 and the chamber body 602. The exhaust port 648 is formed through the second liner 636 and the chamber body 602 as a location below a pedestal 604 disposed in the process volume 640. A pump 650 is in fluid communication with the process volume 640 via the exhaust port 648 and a pump port 646 which surrounds the pedestal 604. The pump 650 enables exhausting of materials from the process volume 640. A lid 616 is coupled to or otherwise integrated with the chamber body 602 opposite the pedestal 604.

The pedestal 604 includes an electrode 606 disposed therein. In one embodiment, the electrode 606 is a chucking apparatus, such as an electrostatic chuck, for securing a substrate 614 thereto during processing of the substrate 614. A conduit 610, such as an electrical conduit or the like, is coupled between the electrode 606 and a power source 612. Power from the power source 612 may be utilized to bias the electrode 606 to either chuck the substrate 614 to the electrode 606 or influence bombardment of electrons on the substrate 614. The electrode 606 and the conduit 610 are surrounded by an insulating material 608, such as a dielectric material, to electrically isolate the electrode 606 and conduit 610 from the pedestal 604.

An actuator 644 is coupled to the pedestal 604 and is configured to raise and lower the pedestal 604 within the process volume 640. The actuator 644 may also cause the pedestal to rotate about a vertical axis. A bellows assembly 642 is disposed about a portion of the pedestal 604 which extends through the chamber body 602 and the bellows assembly 642 is operable to enable vertical movement of the pedestal 604 while maintaining a process environment of the process volume 640. For example, the bellows assembly 642 may be operable to maintain a sub-atmospheric pressure process environment within the process volume 640 while the pedestal 604 is raised or lowered.

A first gas source 630 is in fluid communication with the process volume 640 via a first conduit 628 extending through the chamber body 602. In one embodiment, the first gas source 630 is an inert gas source which supplies an inert gas, such as argon or helium, to the process volume 640. A second gas source 634 is in fluid communication with the process volume 640 via a second conduit 632 extending through the chamber body 602. In one embodiment, the second gas source 634 is a process gas source which supplies a process gas, such as a chlorine containing gas, a fluorine containing gas, a bromine containing gas, oxygen containing gas, or the like, to the process volume 640.

In an alternate embodiment, the first gas source 630 and second gas source 634 may be in fluid communication with the process volume 640 via an electrode 618. In this embodiment, the conduits 628, 632, respectively, are coupled between the gas sources 630, 634 and the process volume 640 via the electrode 618. For example, the conduits 628, 632 may extend through the electrode 618 or the second electrode 618 may include a plurality of apertures to function as a gas delivery showerhead. The apertures may be disposed on the angled surfaces 621 to provide a flow patch of the gas from the gas sources 630, 634 into the process volume 640.

The electrode 618 is coupled to the lid 616 and the electrode 618 is oriented opposite the electrode 606. The electrode 618 includes a segmented surface 620 which includes a plurality of angled surfaces 621. In one embodiment, the substrate 614 is disposed on the electrode 606 of the pedestal 604 in a substantially horizontal orientation. In such an embodiment, the angled surface 621 are oriented in an angled and non-parallel orientation relative to either the substrate 614 or a major axis (horizontal) of the electrode 606. In the illustrated embodiment, the angled surface 621 of the segmented surface 620 are substantially uniform across the electrode 618. Alternatively, the angled surfaces 621 of the segmented surface 620 may be non-uniform. For example, the angled surface 621 may have different angles or may be positioned, spaced, or otherwise oriented in a non-uniform manner to enable fabrication of waveguides with non-uniform gratings.

A conduit 624, such as an electrical conduit or the like, is coupled between the electrode 618 and a power source 626. The electrode 618 and conduit 624 are surrounded by an insulating material 622, such as a dielectric material, to electrically isolate the electrode 618 and conduit 624 from the lid 616.

In operation, a plasma is generated in the process volume 640 by various bulk and surface processes, for example, by capacitive coupling. In this embodiment, the power source 626 is a radio frequency (RF) power source. The power source 626 is operable to generate RF power having a frequency of about 13.56 MHz or about 2 MHz, depending upon desired electron beam characteristics. For example, RF power is applied in a constant or pulsed manner to the electrode 618 and the electrode 606 is biased relative to the electrode 618. In another example, RF power is applied to the electrode 618 and the electrode 606 remains unbiased. It is believed that ions generated by a capacitively coupled plasma are influenced by an electric field that encourages bombardment of the electrode 618 by the ions generated from the plasma. Other plasma generation processes, such as a hollow cathode arrangement, direct current electrode biasing, or electron beam plasma generation processes may be utilized in accordance with the embodiments described herein.

Ion bombardment energy of the electrode 618 and density of the plasma formed in the process volume 640 are controlled, at least in part, by the power source 626 (e.g. RF power source). Ion bombardment of the electrode 618 is believed to heat the electrode 618 and cause the electrode 618 to emit secondary electrons. In one embodiment, the electrode 618 is fabricated from a process compatible material having a high secondary electron emission coefficient, such as silicon, carbon, silicon carbon material, or silicon oxide materials. The electrode 618 may also be fabricated from a metal oxide material such as aluminum oxide, yttrium oxide, or zirconium oxide.

Energetic secondary electrons, which have a negative charge, are emitted from the segmented surface 620 at angles influenced by the angled surface 621 and accelerated away from the electrode 618 due to biasing of the electrode 618. In this example, the electrode 618 may be negatively biased. The angled surfaces 621 of the segmented surface 620 are oriented at an angle between about 1° and about 75° relative to a horizontal datum plan defined by the electrode 606. As such, an electron beam 660 is accelerated from the electrode 618 at a non-normal angle relative to the electrode 606 and the substrate 614.

The flux of energetic electrons from the segmented surface 620 of the electrode 618 is an electron beam. A beam energy of the electron beam 660 is approximately equal to the ion bombardment energy of the electrode 618. In one embodiment, the plasma potential is greater than the potential of the electrode 618 and the energetic secondary electrons emitted from the electrode 618 are further accelerated by a sheath voltage of the plasma as the secondary electrons of the electron beam 660 traverse through the plasma formed in the process volume 640.

At least a portion of the electron beam 660, comprised of the secondary electron flux emitted from the electrode 618 due to energetic ion bombardment of the segmented surface 620, propagates through the process volume 640 and contacts the substrate 614 to etch the substrate 614. In one embodiment, the electron beams 660, in addition to the capacitively generated plasma, generate chemically reactive radicals and ions which may adsorb to the surface of the substrate 614 and form a chemically reactive layer on the surface of the substrate 614.

Figure 7A:
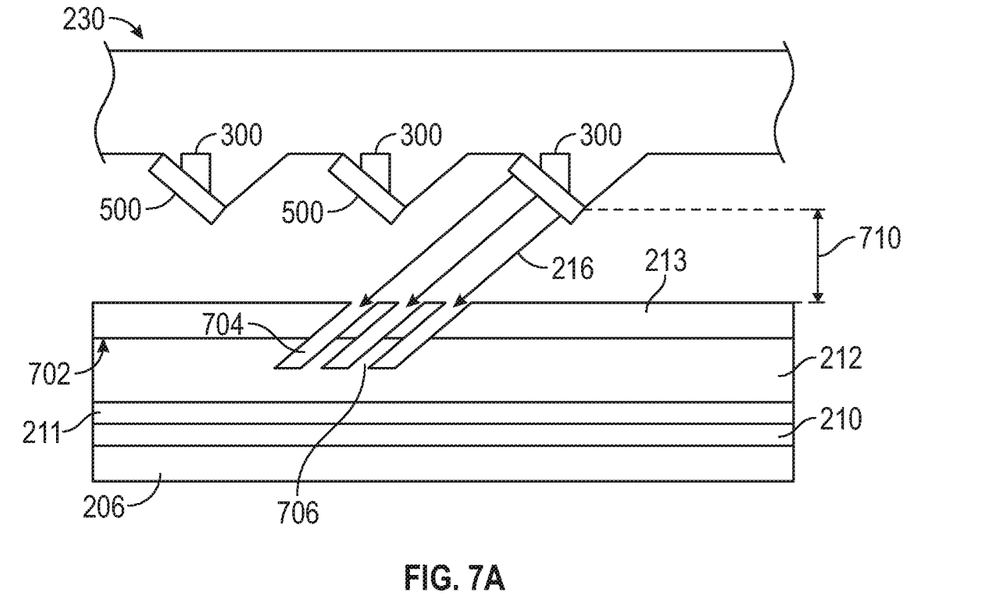
FIG. 7A illustrates an angled etching process performed on a waveguide at a first position according to an embodiment of the disclosure.

FIG. 7A illustrates an angled etching process performed on the substrate 210 at a first position according to an embodiment of the disclosure. The substrate 210 has the grating material 212 disposed thereon and the patterned hardmask 213 is disposed on a surface 702 of the grating material 212. In the illustrated embodiment, the substrate 210 is positioned a first distance 710 from the segmented ion source 230, such as the segmented ion sources described with regard to the ion beam system 200 of FIGS. 2-5B. In another embodiment, the substrate 210 may be processed by the system 600 utilizing the segmented surface 620 of the electrode 618 to generate an electron beam to etch the grating material 212.

The ion beam 216 (or electron beam 660) is directed toward the substrate 210 at a non-normal angle relative to a major axis of the substrate 210. The patterned resist 213 exposes certain regions at the surface 702 of the grating material 212 which is etched by the ion beam 216 or electron beam 660. As a result, recesses 704 and fins 706 are formed in the grating material 212. While only two fins 706 and three recesses 704 are illustrated, the entire grating material 212 or desired portions thereof may be etched to form the recesses 704 and fins 706 depending upon the desired grating design for the waveguide to be fabricated. The fins 706 and recesses 704 collectively comprise a grating.

Figure 7B:
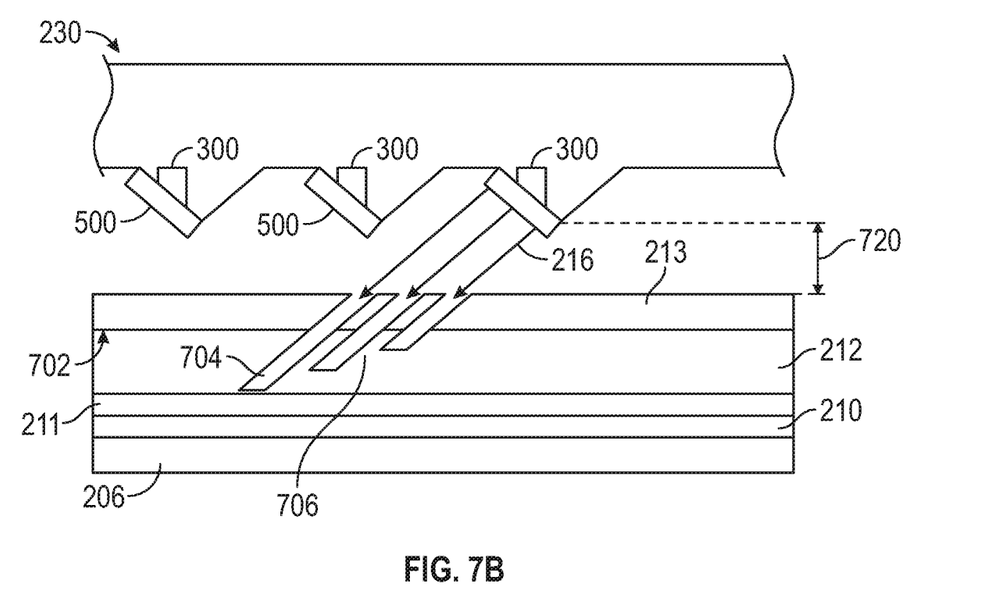
FIG. 7B illustrates the waveguide of FIG. 7A during the angled etching process at a second position according to an embodiment of the disclosure.

FIG. 7B illustrates the substrate 210 of FIG. 7A during the angled etching process at a second position according to an embodiment of the disclosure. The second position locates the substrate 210 a second distance 720 from the segmented ion source 230 (or segmented surface 620 of the electrode 618). In one embodiment, the second distance 720 is less than the first distance 710. In another embodiment, the second distance 720 is greater than the first distance 710. The substrate 210 may be elevated from the first distance 710 to the second distance 720 by the platen 206 or pedestal 604 depending upon the apparatus 200, 600 utilized. By changing the distance, etching and beam exposure characteristics are changed which result in different etching profiles of the grating material 212. For example, certain recesses 704 may extend deeper into the grating material 212 from the surface 702 while other recesses are more shallow. Thus, the fins 706 may have different magnitudes and may modulate light propagating through the waveguide.

Figure 8:
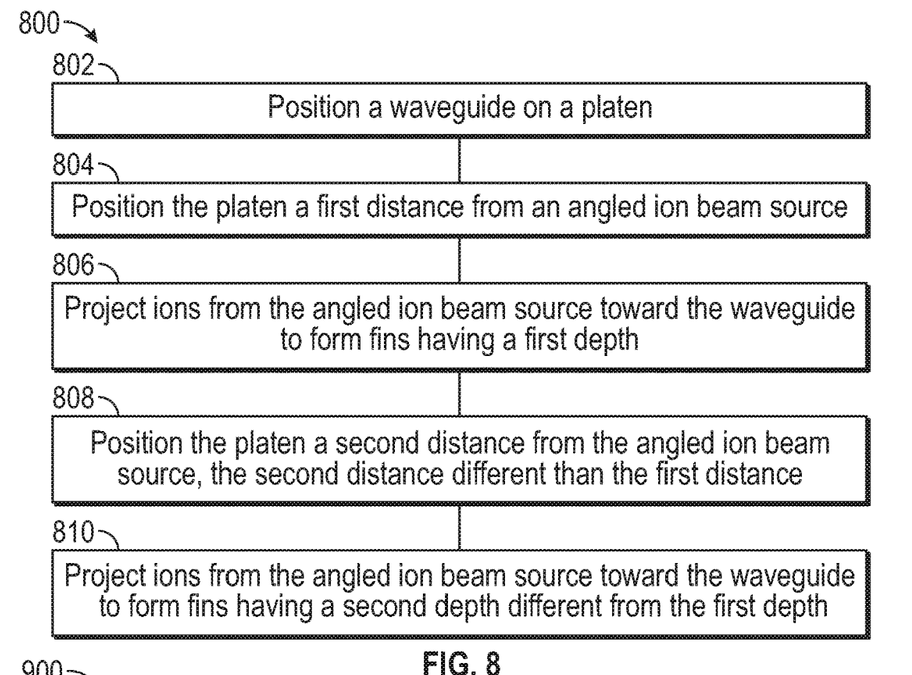
FIG. 8 illustrates operations of a method for etching a waveguide with an angled ion beam according to an embodiment of the disclosure.

FIG. 8 illustrates operations of a method 800 for etching a waveguide with an angled ion beam according to an embodiment of the disclosure. At operation 802, a waveguide (or substrate, such as the substrate 216, to be fabricated into a waveguide) is positioned on a platen. In one example, the waveguide is positioned on the platen 206. At operation 804, the platen is positioned a first distance from an angled ion beam source. For example, the platen 206 is positioned a first distance 710 from the segmented ion source 230.

At operation 806, ions are projected from the angled ion beam source toward the waveguide to form fins having a first depth. At operation 808, the platen is positioned a second distance from the angled ion beam source. The second distance is different from the first distance. In one example, the platen 206 is positioned the second distance 720 from the segmented ion source 230. At operation 810, ions are projected from the angled ion beam source toward the waveguide to form fins having a second depth different from the first depth. The depth of the fins 706 concerns the distance the fins 706 extend into the grating material 212 and also correlates to the depth of the recesses 704. In one embodiment, the second depth is greater than the first depth. In another embodiment, the second depth is less than the first depth.

Figure 9:
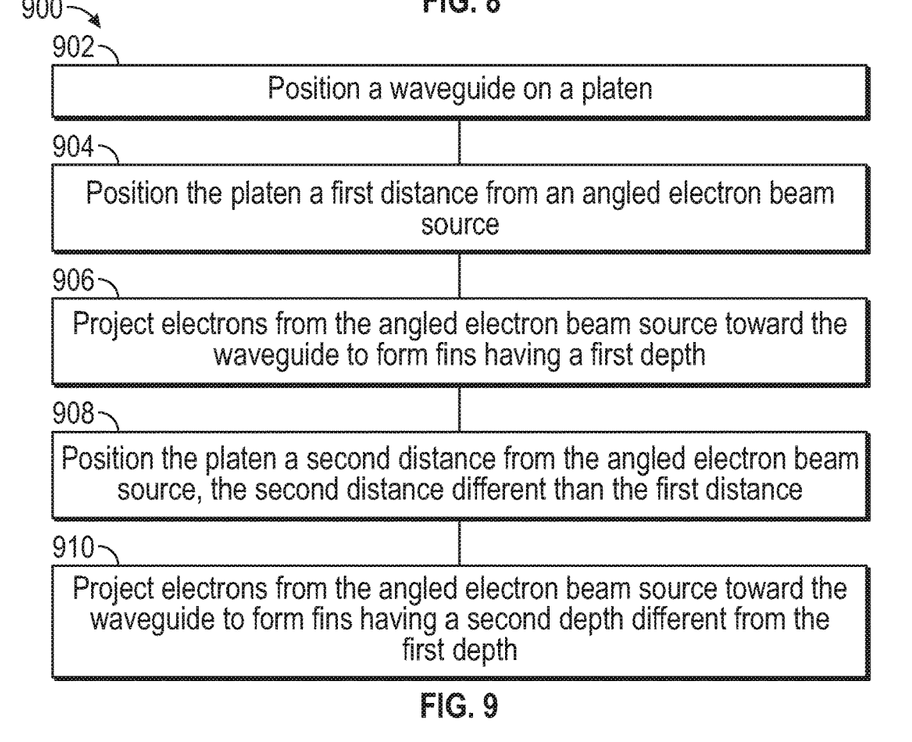
FIG. 9 illustrates operations of a method for etching a waveguide with an angled electron beam according to an embodiment of the disclosure.

FIG. 9 illustrates operations of a method 900 for etching a waveguide with an angled electron beam according to an embodiment of the disclosure. At operation 902, a waveguide (or substrate, such as the substrate 216, to be fabricated into a waveguide) is positioned on a platen. In one example, the waveguide is positioned on the pedestal 604. At operation 904, the platen is positioned a first distance from an angled electron beam source. For example, the pedestal 604 is positioned a first distance 710 from the segmented surface 620 of the electrode 618.

At operation 906, electrons are projected from the angled electron beam source toward the waveguide to form fins having a first depth. At operation 908, the platen is positioned a second distance from the angled electron beam source. The second distance is different from the first distance. In one example, the pedestal 604 is positioned the second distance 720 from the segmented surface 620 of the electrode 618. At operation 810, electrons are projected from the angled electron beam source toward the waveguide to form fins having a second depth different from the first depth. The depth of the fins 706 concerns the distance the fins 706 extend into the grating material 212 and also correlates to the depth of the recesses 704. In one embodiment, the second depth is greater than the first depth. In another embodiment, the second depth is less than the first depth.

The methods 800, 900 respectively enable waveguide fabrication utilizing ion and electron beams. It is contemplated that the methods 800, 900 may utilize a single etching cycle or multiple etching cycles. In one example, a 45° angled etching process may be performed about 14 times for a duration of about 300 seconds per time. In this example, an approximately 240 nm deep recess was formed with an etching rate of about 3 nm/min. In another example, a 60° angled etching process may be performed for about 18 times for a duration of about 300 seconds per time. In this example, an approximately 190 nm deep recess was formed with an etching rate of about 1.8 nm/min. However, it is contemplated that the apparatus and methods described herein may enable etching rates up to about 50 nm/min, depending upon the process variables of the ion or electron beam etching process and the desired angle of etch.

The methods 800, 900 may be utilized for blanket substrate etches over substantially the entire substrate surface or for more localized etching processes when specified regions of the substrate are etched preferentially to other regions. The segmented ion source 230 and segmented surface 620 of the electrode 618 enable improved angled etching efficiency with ion and electron beams, respectively. It is also contemplated that segmented ions sources 230 and segmented surfaces 620 of the electrode 618 may be swapped out of their respective systems 200, 600 to more efficiently change etching profiles of waveguides which embody gratings having a plurality of fin heights and recess or trench depths or with gratings of different angles.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
positioning a pedestal opposite an electrode in a volume of a chamber, the electrode comprising one or more angled surfaces;
projecting electrons from the one or more angled surfaces toward the pedestal at one or more non-normal angles; and
generating a plasma in the volume, wherein the plasma is generated by capacitive coupling between the pedestal and the electrode.

2. The method of claim 1, where the electrons projected from the one or more angled surfaces of the electrode comprise an electron beam.

3. The method of claim 1, further comprising:
positioning a substrate on the pedestal and forming fins on the substrate.

4. The method of claim 3, wherein the fins are formed in a grating material disposed on the substrate.

5. The method of claim 1, further comprising:
bombarding the electrode with ions from the plasma.

6. The method of claim 1, wherein the electrode is formed from one or more of a silicon material, a carbon material, a silicon carbon material, a silicon oxide material, an aluminum oxide material, a yttrium oxide material, and a zirconium oxide material.

7. The method of claim 1, further comprising:
positioning the pedestal a first distance from the one or more angled surfaces; and
positioning the pedestal a second distance from the one or more angled surfaces, wherein the first distance and second distance are different.

8. A method, comprising:
positioning a substrate on a pedestal in a process volume of a chamber;
positioning the pedestal opposite an electrode in a volume of a chamber, the electrode comprising a plurality of non-uniform angled surfaces;
projecting electrons from the plurality of non-uniform angled surfaces toward the pedestal at a plurality of non-normal angles;
forming a plurality of non-uniform recesses on the substrate to form a non-uniform grating;
positioning the pedestal a first distance from the electrode;
forming the plurality of non-uniform recesses with a first depth;
positioning the pedestal a second distance from the electrode, the second distance different from the first distance; and
forming the plurality of non-uniform recesses with a second depth, the second depth different from the first depth.

9. The method of claim 8, further comprising:
generating a plasma in the process volume;
bombarding the electrode with ions from the plasma; and
generating an electron beam from the electrons projected from the electrode.

10. A method, comprising:
generating a plasma in a volume of a chamber;
bombarding an electrode with ions from the plasma, the electrode comprising one or more angled surfaces disposed opposite a pedestal in the volume;
biasing the electrode or the pedestal;
projecting electrons from the electrode toward the pedestal at one or more non-normal angles;
positioning the pedestal a first distance from the electrode, the pedestal having a substrate positioned thereon;
etching the substrate with electrons to form one or more angled fins on the substrate with a first depth;
positioning the pedestal a second distance from the electrode, wherein the first and second distance are different; and
forming the one or more angled fins on the substrate with a second depth different from the first depth.

11. The method of claim 10, the electrons projected from the one or more angled surfaces of the electrode comprise an electron beam.

12. The method of claim 11, wherein a beam energy of the electron beam is approximately equal to an ion bombardment energy of the electrode.

13. The method of claim 11, wherein the electrons are accelerated by a sheath voltage of the plasma as the electron beam traverses through the plasma.

14. A method, comprising:
positioning a substrate on a pedestal of a chamber;
generating a plasma in a volume of the chamber;
bombarding an electrode with ions from the plasma, the electrode comprising one or more angled surfaces disposed opposite the pedestal in the volume;
biasing the electrode or the pedestal;
projecting electrons from the electrode toward the pedestal at one or more non-normal angles; and
etching the substrate with the electrons to form one or more angled fins on the substrate, wherein the plasma generates one or more chemically reactive radicals or ions which form a layer on the substrate.

15. A method, comprising:
generating a plasma in a volume of a chamber;
bombarding an electrode with ions from the plasma, the electrode comprising one or more angled surfaces disposed opposite a pedestal in the volume;
biasing the electrode or the pedestal; and
projecting electrons from the electrode toward the pedestal at one or more non-normal angles, wherein a potential of the plasma is greater than a potential of the electrode.

* * * * *